(12) United States Patent
Fields

(10) Patent No.: US 8,153,532 B1
(45) Date of Patent: Apr. 10, 2012

(54) BILAYER DIELECTRIC INTERCONNECTION PROCESS

(75) Inventor: Charles H Fields, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 586 days.

(21) Appl. No.: 12/328,102

(22) Filed: Dec. 4, 2008

(51) Int. Cl.
*H01L 21/302* (2006.01)

(52) U.S. Cl. ......... 438/738; 438/706; 438/734; 438/735

(58) Field of Classification Search ............ 438/700, 438/712, 717, 735, 740, 706, 714, 723, 724, 438/734, 738
See application file for complete search history.

(56) References Cited

U.S. PATENT DOCUMENTS

| | | | | |
|---|---|---|---|---|
| 5,619,064 A * | 4/1997 | Cho | ................... | 257/637 |
| 6,090,697 A | 7/2000 | Xing | | |
| 6,635,185 B2 * | 10/2003 | Demmin et al. | ............... | 216/64 |
| 6,828,162 B1 | 12/2004 | Summerfelt | | |
| 7,635,620 B2 * | 12/2009 | Chen et al. | .................. | 438/199 |
| 2007/0108525 A1 * | 5/2007 | Yang et al. | .................. | 257/351 |

* cited by examiner

*Primary Examiner* — Lan Vinh
(74) *Attorney, Agent, or Firm* — George R. Rapacki; Daniel R. Allemeier

(57) ABSTRACT

The present invention improves the yield of integrated circuit manufacture by making the circuit more tolerant of varying thicknesses of the InterLayer Dielectric prior to metallization and interconnection. The sensitivity to the thickness of the ILD is reduced by first coating the devices with an etch stop layer, exposing the areas of the devices where interconnections will be made, selectively etching away the etch stop layer over the interconnection areas, adding the Interlayer Dielectric and then finally etching away the ILD to expose the contacts and continuing the processing through interconnection of the devices.

18 Claims, 6 Drawing Sheets

BILAYER DIELECTRIC INTERCONNECTION PROCESS

BACKGROUND

This invention describes a method for exposing contacts on separate HFETS, HBTs, HEMTs prior to the final metallization step of an integrated circuit manufacture. The method improves the circuit yield by reducing the opportunity for the final interconnection of the circuit to short out the circuit or fail to make a connection at all.

FIGS. 1 a-e describes the prior art method of preparing built up integrated circuits for interconnection with metallization layers. The circuit 100 is first built of a number of layers. Next, portions of the exposed layers are cut away, doped and in some cases metallized to create the structure in FIG. 1a Integrated circuits as shown in FIG. 1a typically need active devices such as transistors and passive devices such as resistors. These may be built on the integrated circuit as shown in FIG. 1b. For example, to build a resistor in FIG. 1b a layer 32 of silicone nitride is added then a layer 30 of a thin film resistive material. The locations where a resistor are desired is covered in photo resist, a mask is used to control the exposure of the photo resist to light, then the unexposed photo resist is removed leaving the photo resist 34 over the desired resistor location. Next, in step 36 the layers 30 and 32 are etched away with carbon tetrafluoride or sulfur hexafluoride or other etchant depending on the composition of layers 32 and 30. Finally, the photo resist 34 is removed leaving the device 100 with a passive resistor 40 ready for interconnection.

The interconnection process begins with constructing contacts 50, 52 and 54 to the terminals of the device using techniques known in the art as shown in FIG. 1d. Note that the height of the contact above the terminals is 60 or $D_1$ and the height of a terminal is 62 or $D_2$. Next, in FIG. 1d, an Interlayer Dielectric (ILD) layer 64 is applied over the whole device. The ILD layer 64 may be a spun on glass, Benzene CycloButane, Polyimide, silicon oxide or silicon nitride or similar materials. The ILD layer 64 is etched back in step 66 in FIG. 1e to expose the contacts 50, 52 and 54. The etching of the ILD has to be enough to expose all contacts but not so much as to expose any terminals 10, 12 or 14. If the terminals are exposed and the metallization layers applied there is a chance the metallization will make undesired contact with the exposed terminals. Alternatively, if the etching is enough to expose some contacts but not all then the metallization process will end with some connections not made. Either event results in failed circuits that reduce the yield.

FIG. 2a illustrates how over etching the ILD 318 can lead to undesired circuit interconnections. In FIG. 2a, two groups of devices are built on the same integrated circuit, the denser devices are 240 and the more isolated device is 250. Devices 240 and 250 may be near each other or far apart where near and far are relative to the thickness of the ILD layer 318. Each device 240, 250 has a terminal 14 and a contact 50. The contacts are at a height 62. An ILD layer 318 is added over all devices. Those devices near each other are more likely to have the same thickness of ILD 318 over each device. The ILD layer 318 over an isolated device 250 will likely have a different thickness 220. Varying thicknesses may result from the topography, non uniform application of the coating or other influences.

The ILD layer 318 in FIG. 2a is etched back a thickness 210 ($D_2$) to reveal the contacts 50. However, in the case of device 250 the etch back should be only the thickness 220 ($D_1$). If the difference in thicknesses $D_2$–$D_1$ is greater than the height 62 of the contact 50 then the etch back process will reveal the terminal 14 on device 250. A subsequent metallization layer may make an undesired connection to terminal 14.

The equally undesired alternative of insufficient etch back is shown in FIG. 2b. In FIG. 2b the ILD 318 is etched back a thickness 220 ($D_2$) to expose contact 50 of device 250. However, this is insufficient to expose contact 50 of devices 240. A subsequent metallization layer will fail to contact devices 240 leading to circuit failure and reduced yield.

Even if the etch back allows all necessary connections, the interconnection metallization process will create parasitic capacitance between the metallization layer and any contacts 50 not connected to the metallization layer. One way to reduce the parasitic capacitance is to increase the separation between the metallization layer and any underlying contacts 50

A solution is needed to desensitize the etch back of the ILD layer 318, prior to metallization, to variations in thickness of the ILD layer. It would be beneficial to reduce the parasitic capacitance too.

SUMMARY

In a first embodiment, applying a first layer which is usually an etch stop layer over the contacts and devices on an integrated circuit. Then etching away the first layer over the contacts of the devices of an integrated circuit. Then covering the devices and contacts of the integrated circuit with a second layer of a different material. Then etching away the second layer with an etchant that etches the second layer at a rate greater then twice the rate of the etchant etching the first layer.

In a second embodiment, the first embodiment where the first layer is an etch stop layer that may be made of silicon oxide, silicon nitride or polysilicone.

In another embodiment, the first embodiment where the second layer comprises an Interlayer Dielectric.

In a fourth embodiment, a method of preparing a semiconductor integrated circuit for interconnection comprising coating one or more devices of the integrated circuit with a non conductive first dielectric layer, then masking off none or more contacts of one or more devices. Next, etch away the first dielectric layer covering none or more contacts of one or more devices with a first etching material, then covering the one or more devices of the integrated circuit with a second dielectric layer. Next, planarize the second dielectric layer without exposing one or more contacts of one or more devices, then masking off none or more contacts of one or more devices. Next, etching away the second dielectric layer covering the one or more devices with a second etching material, wherein the second etching material removes the second dielectric layer at least at twice the rate the second etching material removes the first dielectric layer.

In a fifth embodiment, the method of the fourth embodiment wherein the first dielectric layer comprises silicon oxide, silicon nitride or polysilicone.

In a sixth embodiment, the method of the fourth embodiment wherein the second dielectric layer comprises silicon oxide, silicon nitride, polysilicone, polyimide, benzenecyclobutane, or spun on glass.

In another embodiment, the method of the fourth embodiment wherein the second etching material comprises a fluorine based compound.

In another embodiment, the previous embodiment wherein the fluorine based compound comprises carbon tetraflouride or sulfur hexafluoride.

In another embodiment, the method of the fourth embodiment wherein the semiconductor integrated circuit comprises one or more devices made of Group III-V or Group II-VI materials.

DESCRIPTION OF THE DRAWINGS

The objects, features and advantages of the invention will be apparent from the following detailed description of the preferred embodiment of the invention in conjunction with reference to the following drawings where.

DESCRIPTION

Figure 1A:
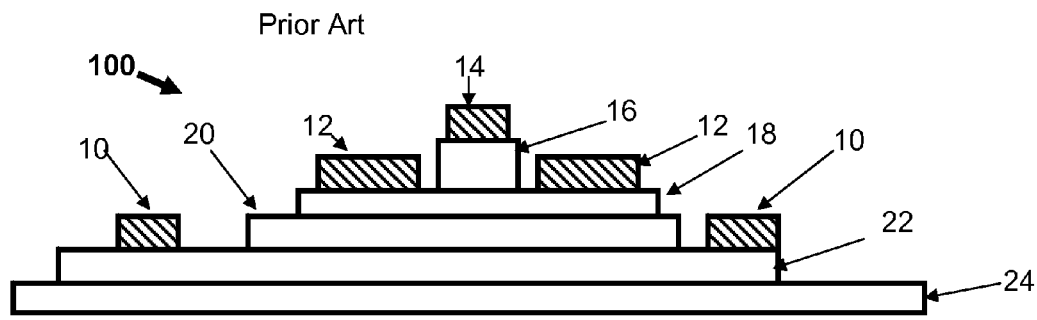
FIGS. 1A-E shows the prior art technique for preparing devices for interconnection for devices built in layers atop a substrate.
Figure 1B:
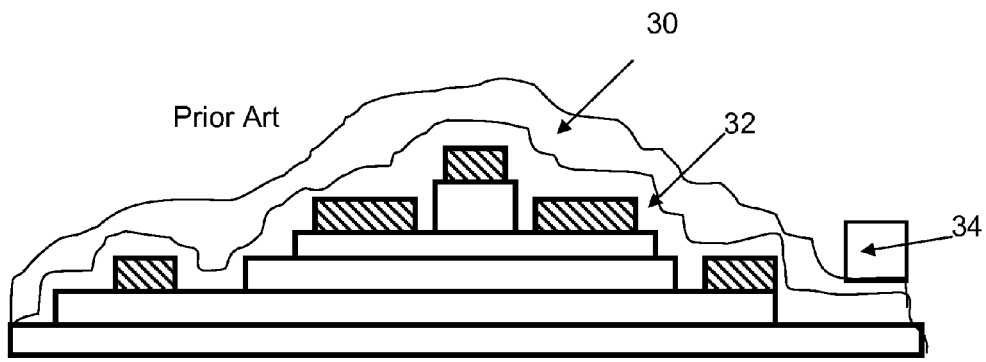
Figure 1C:
Figure 1C:
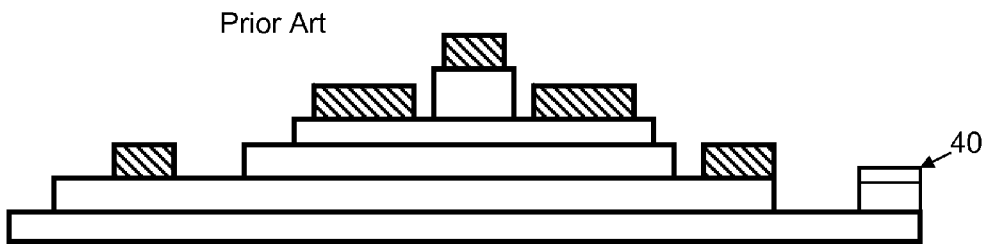
Figure 1D:
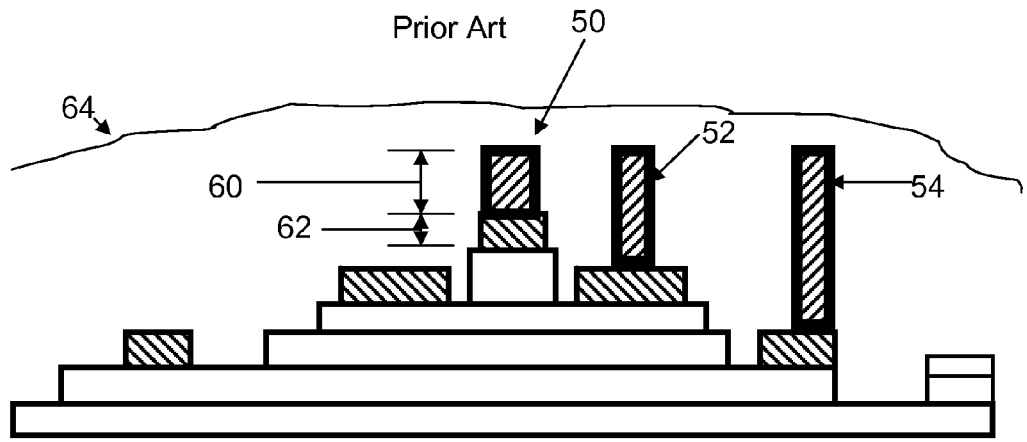
Figure 1E:
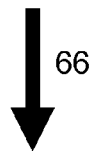
Figure 1E:
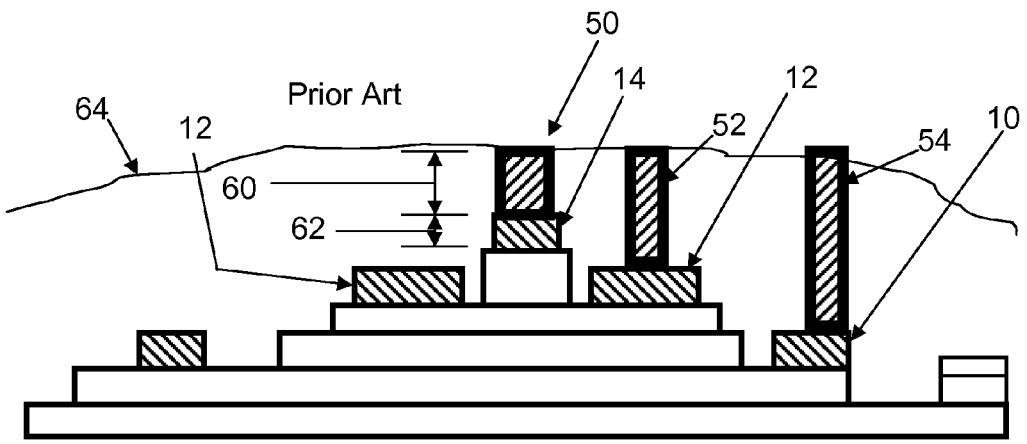
Figure 2A:
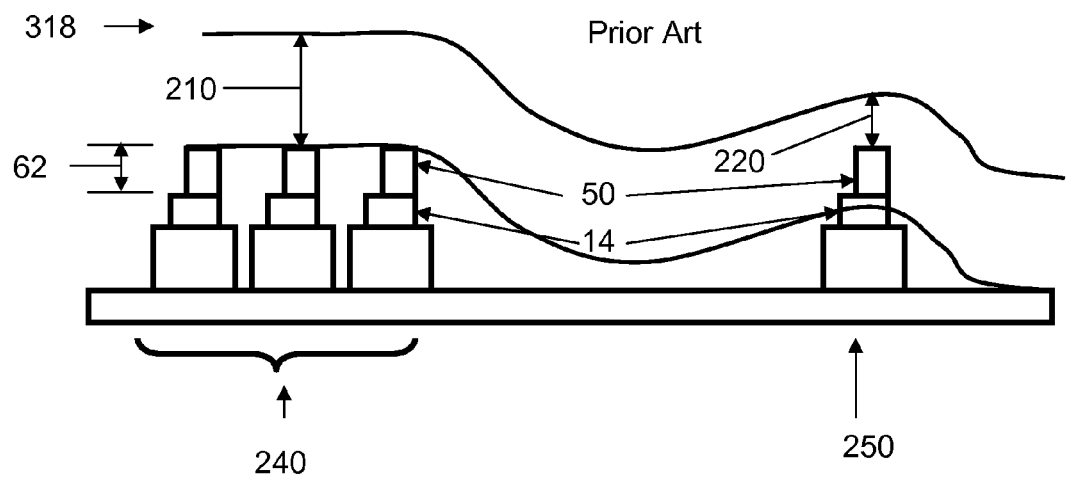
FIGS. 2A-B illustrates the problem with the prior art approach solved by the invention described herein.
Figure 2B:
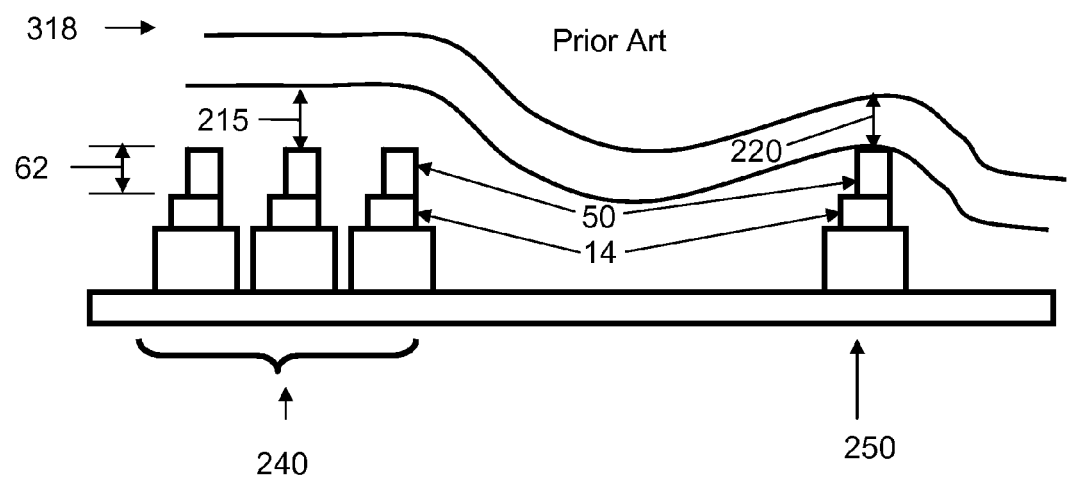

This invention is directed to methods of improving the yield of integrated circuits by enlarging the process window. In particular, the overall yield of integrated circuit fabrication is increased by applying an etch stop layer before the final Interlayer Dielectric layer (ILD) and then using an etch with different etch rates for the ILD compared to the etch stop layer to expose device contacts before the metallization layer is applied. The result is improved tolerance of variations in ILD layer thickness when adding the metallization layer to make connections.

The following description is presented to enable one of ordinary skill in the art to make and use the invention and to incorporate it in the context of particular applications. Various modifications, as well as a variety of uses in different applications will be readily apparent to those skilled in the art, and general principles defined herein may be applied to a wide range of embodiments. Thus the invention is not intended to be limited to the embodiments presented, but is to be accorded the widest scope consistent with the principles and novel features disclosed herein.

In the following detailed description, numerous specific details are set forth in order to provide a more thorough understanding of the invention. However, it will be apparent to one skilled in the art that the invention may be practiced without necessarily being limited to specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All features disclosed in this specification, (including any accompanying claims, abstract, and drawings) may be replaced by alternative features serving the same, equivalent or similar purpose, unless expressly stated otherwise. Unless expressly stated otherwise, each feature disclosed is one example only of a generic series of equivalents or similar features.

Any element in a claim that does not explicitly state "means for" performing a specified function, or "step for" performing a specific function, is not to be interpreted as a "means" or "step" clause as specified in 35USC Section 112, Paragraph 6. In particular, the use of step of or act of in the claims herein is not intended to invoke the provisions of 35USC Section 112 Paragraph 6.

The invention will be described with reference to the accompanying drawings. This invention may be embodied in many different forms and should not be construed as limited to the embodiments set forth herein. Further, the dimensions, materials and other elements shown in the accompanying drawings may be exaggerated to show details. The invention should not be construed as being limited to the dimensional or spatial relations or symmetry shown in the drawings, nor should the individual elements shown in the drawings be construed to be limited to the dimensions shown.

The drawings and accompanying descriptions are meant to provide the structure for the function performed by the components described in the drawings and accompanying descriptions.

Figure 3A:
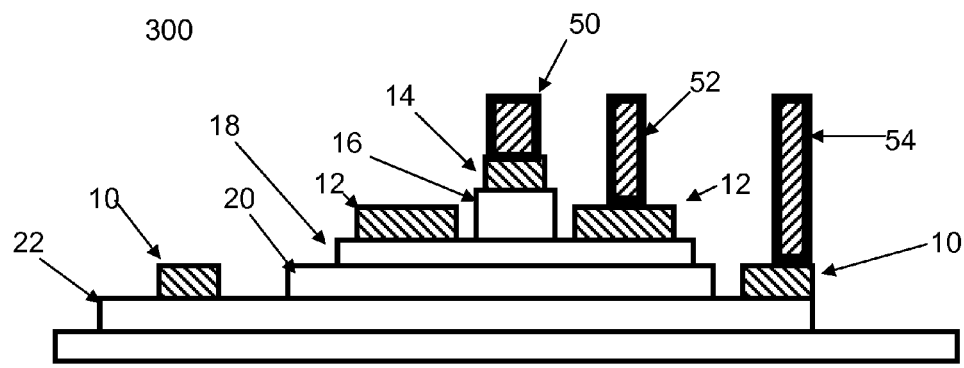
FIGS. 3A-H illustrates the present invention.
Figure 3B:
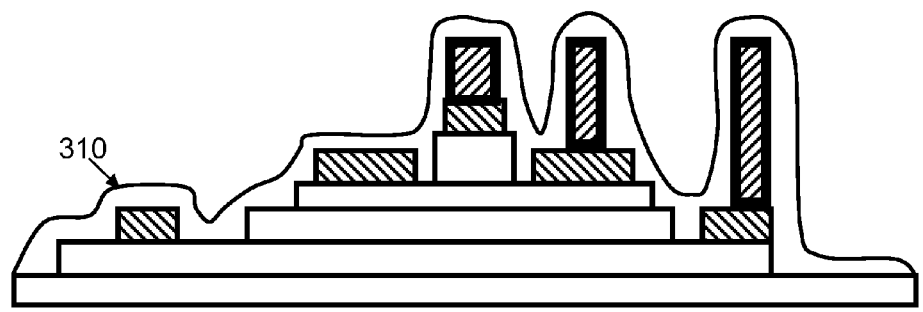

FIGS. 3a through 3h describe using an etch stop layer over the devices 300 to decrease the sensitivity to the etch back of the ILD layer. FIG. 3a shows the device with contacts 50, 52 and 54 on top of terminals 14, 12 and 10 respectively. An etch stop layer 310 is added by techniques known in the art over the circuit in FIG. 3b. The etch stop layer 310 is a non-conductive, dielectric material. Although only one circuit 300 is shown in the figures, the reader will realize that multiple devices 300 or other devices may be built on a common substrate and the etch stop layer 310 will cover those devices as well.

Figure 3C:
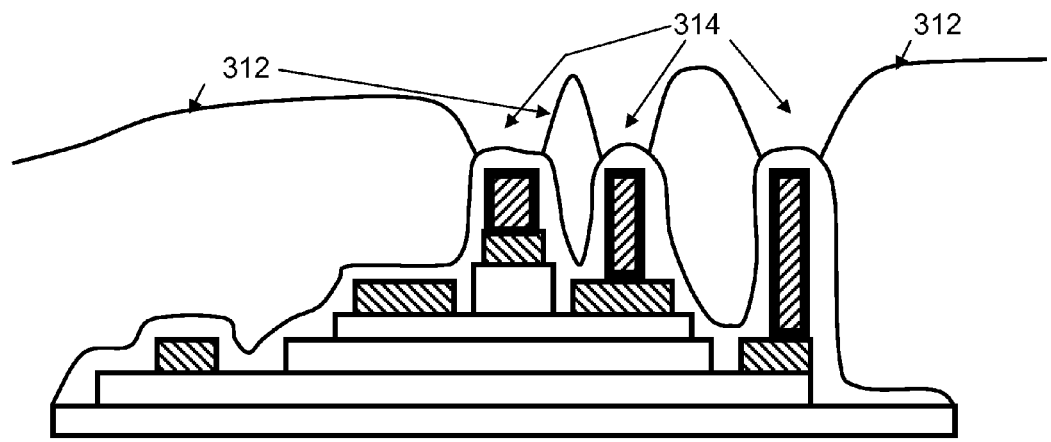
Figure 3D:
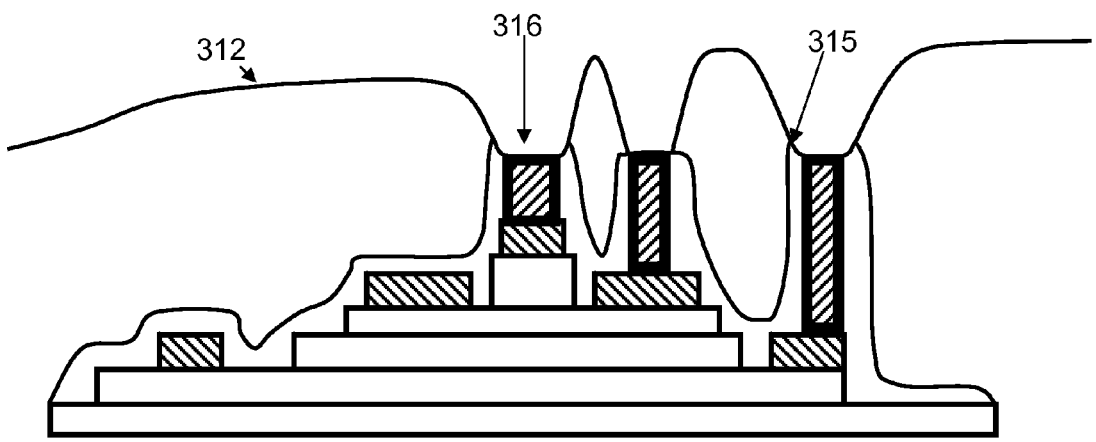
Figure 3E:
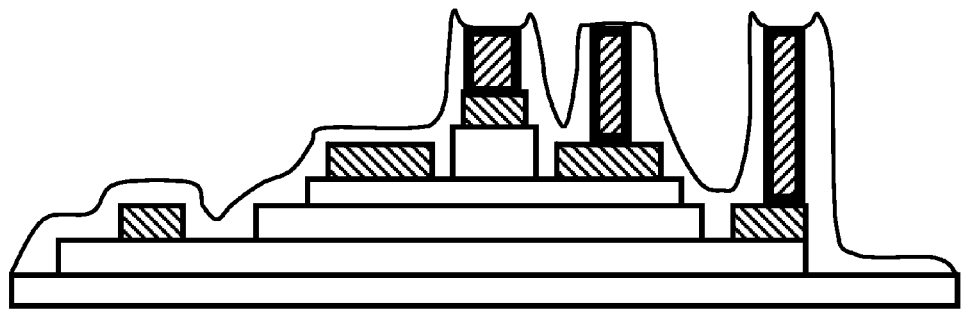

After the etch stop layer 310 is applied, photoresist 312 is applied, the locations of the contacts are masked off, the photo resist is exposed and the unexposed photo resist removed thus exposing the etch stop layer 310 over the contacts 50, 52 and 54 in regions 314 as shown in FIG. 3c. Next, as shown in FIG. 3d, an etchant capable of removing the etch stop layer 310 is used to expose the contacts 50, 52 and 54. Note the remainder of the device and in particular the terminals 14, 12 and 10 are still covered by the etch stop layer 310. The photo resist 312 is removed, leaving the device as shown in FIG. 3e.

Figure 3F:
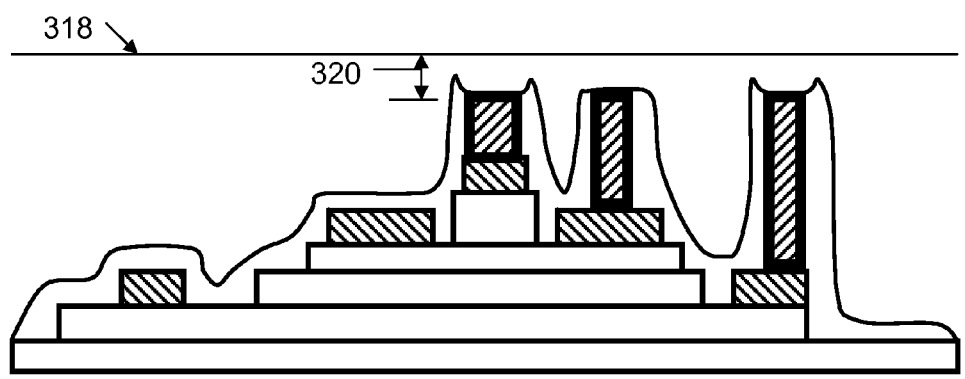
Figure 3G:
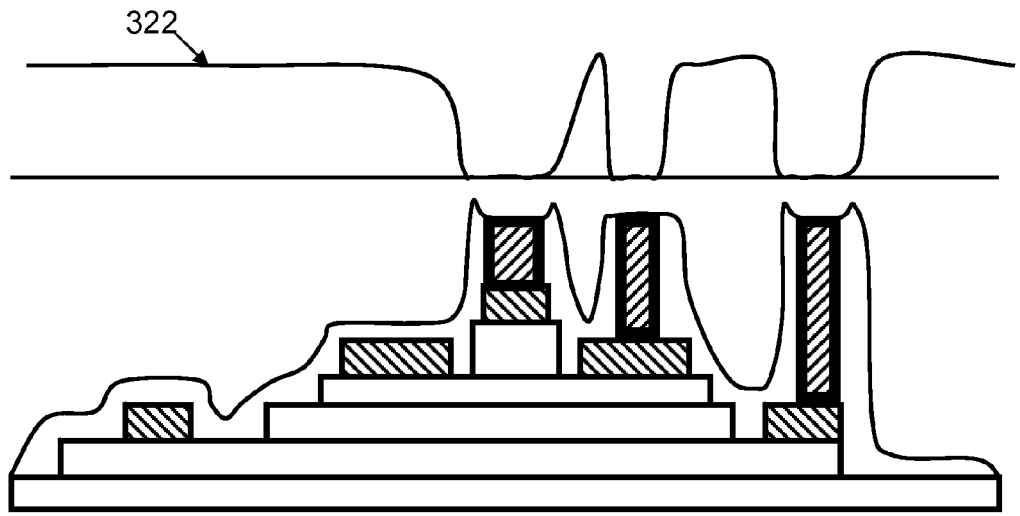
Figure 3H:
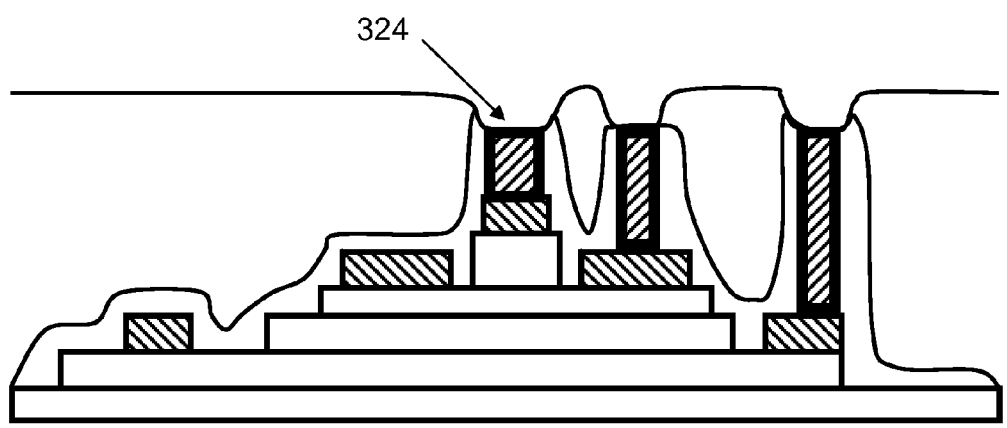

In FIG. 3f an InterLayer Dielectric (ILD) layer 318 is added. The ILD may be spun on glass. The ILD may be cured through thermal cycling if necessary. A blanket etch may be used to planarize and uniformly reduce the thickness of the ILD layer 318 such that the contacts of the underlying devices are not exposed. The ILD layer 318 is covered with photo resist 322, masked and exposed to open holes in the photo resist over the contacts of the underlying devices. An etchant is used to remove the ILD layer 318 above the contacts 50, 52 and 54 as shown in FIG. 3g. The etchant may be a dry or wet etchant depending on the materials used for the ILD layer and the etch stop layer. Next, the photo resist 322 is removed leaving the device shown in FIG. 3h, ready for metallization and interconnection. Because the terminals 14, 12 and 10 are covered by the etch stop layer, the final etch back of the ILD layer 318 reduces the risk of exposure of the terminals 14, 12 or 10 while exposing 324 contacts 50, 52 and 54 shown by FIG. 3h. Optionally, via holes may be etched down to passive devices. Finally, interconnect metallization is used to wire up the circuit, connecting the active devices to each other and to passive components as prescribed by the circuit designer.

The materials used for the etch stop layer, the ILD, and the etchant to remove the ILD layer are selected such that the ILD layer can be removed at least at twice the rate of etching the etch stop layer. The ILD layer may be made of, without limitation, of Spun on Glass, Benzene Cyclobutane, Polyimide, Silicon Nitride, Silicon Oxide and Polysilicon. The Etch Stop Layer may be made of, without limitation, Silicon Nitride, Silicon Oxide and Polysilicon. The etch stop layer may not be made of the same material as the ILD layer. The ILD etchant, without limitation, may be a fluorine based compound such as carbon tetraflouride or sulfur hexafluoride, or Oxygen plasma. The choice of ILD and etch stop layer materials depend on, or dictate, the ILD etchant.

While the foregoing process has been described in terms of compound semiconductor devices based on Group III-V elements, the same technique, but with suitably different materials for the ILD layer, etch stop layer and ILD etchant, may be used when the compound semiconductor device is based on Group II-VI elements and Group II-V elements. Non limiting examples of Group III-V compound semiconductors are devices based on GaN, GaAs, InP, SiC, AlGaN, InAs, InGaAs, InGaP, InGaAsP.

What is claimed is

1. A method of preparing a semiconductor integrated circuit for interconnection comprising:
    coating one or more devices of the integrated circuit with a non conductive first layer;
    exposing one or more contacts of one or more devices by selectively etching the first layer with a first etching material;
    covering the one or more devices of the integrated circuit with a second layer;
    exposing the one or more contacts of the one or more devices by selectively etching the second layer with a second etching material;
    wherein the second etching material removes the second layer at least at twice the rate the second etching material removes the first layer.

2. The method of claim 1 wherein the semiconductor integrated circuit comprises one or more devices made of Group III-V materials.

3. The method of claim 1 wherein the semiconductor integrated circuit comprises one or more devices made of Group II-VI materials.

4. The method of claim 1 wherein the integrated circuit comprises one or more Heterojunction Bipolar Transistors or Heterojunction Field Effect Transistors.

5. The method of claim 1 wherein the first layer is different from the second layer.

6. The method of claim 1 wherein the first layer is an etch stop layer.

7. The method of claim 6 wherein the etch stop layer comprises silicon oxide, silicon nitride or polysilicone.

8. The method of claim 1 wherein the second layer is an Interlayer Dielectric layer.

9. The method of claim 8 wherein the InterlayerDielectric layer comprises silicon oxide, silicon nitride, polysilicone, polyimide, benzenecyclobutane, or spun on glass.

10. The method of claim 1 wherein the second etching material comprises a fluorine based compound.

11. The method of claim 10 wherein the fluorine based compound comprises carbon tetrafluoride or sulfur hexafluoride.

12. A method of preparing a semiconductor integrated circuit for interconnection comprising:
    coating one or more devices of the integrated circuit with a non conductive first dielectric layer;
    masking off one or more contacts of one or more devices;
    exposing the one or more contacts of one or more devices by etching away the first dielectric layer with a first etching material;
    covering the one or more devices of the integrated circuit with a second dielectric layer;
    planarizing the second dielectric layer without exposing one or more contacts of one or more devices;
    masking off the one or more contacts of one or more devices;
    exposing the one or more contacts by etching away the second dielectric layer with a second etching material;
    wherein the second etching material removes the second dielectric layer at least at twice the rate the second etching material removes the first dielectric layer.

13. The method of claim 12 wherein the first dielectric layer comprises silicon oxide, silicon nitride or polysilicone.

14. The method of claim 12 wherein the second dielectric layer comprises silicon oxide, silicon nitride, polysilicone, polyimide, benzenecyclobutane, or spun on glass.

15. The method of claim 12 wherein the semiconductor integrated circuit comprises one or more devices made of Group III-V materials.

16. The method of claim 12 wherein the semiconductor integrated circuit comprises one or more devices made of Group II-VI materials.

17. The method of claim 12 wherein the second etching material comprises a fluorine based compound.

18. The method of claim 17 wherein the fluorine based compound comprises carbon tetrafluoride or sulfur hexafluoride.

* * * * *